(12) United States Patent
Kushida et al.

(10) Patent No.: US 7,748,760 B2
(45) Date of Patent: Jul. 6, 2010

(54) WORK HOLDING MECHANISM

(75) Inventors: Toshikazu Kushida, Osaka (JP); Yohei Oka, Osaka (JP)

(73) Assignee: DAIHEN Corporation, Osaka (JP)

( * ) Notice: Subject to any disclaimer, the term of this patent is extended or adjusted under 35 U.S.C. 154(b) by 379 days.

(21) Appl. No.: 11/977,192

(22) Filed: Oct. 24, 2007

(65) Prior Publication Data
US 2008/0099970 A1    May 1, 2008

(30) Foreign Application Priority Data
Oct. 27, 2006   (JP) .............................. 2006-291988

(51) Int. Cl.
B25J 15/00     (2006.01)
B65G 49/07    (2006.01)

(52) U.S. Cl. .................. 294/1.1; 294/106; 294/907; 414/941

(58) Field of Classification Search .............. 294/1.1, 294/106, 110.1, 902, 907; 414/935, 936, 414/941; 901/46; 34/58
See application file for complete search history.

(56) References Cited

U.S. PATENT DOCUMENTS

| | | | | |
|---|---|---|---|---|
| 5,775,000 A | * | 7/1998 | Maekawa et al. ............... | 34/58 |
| 5,954,072 A | * | 9/1999 | Matusita ..................... | 134/149 |
| 6,276,731 B1 | * | 8/2001 | Hino ........................... | 294/1.1 |
| 6,979,034 B2 | * | 12/2005 | McNurlin et al. ........... | 294/106 |

FOREIGN PATENT DOCUMENTS

| JP | 6-155213 | 6/1994 |
|---|---|---|
| JP | 10-74816 | 3/1998 |
| JP | 3138554 | 12/2000 |
| JP | 2006-150538 | 6/2006 |

* cited by examiner

*Primary Examiner*—Dean J Kramer
(74) *Attorney, Agent, or Firm*—Hamre, Schumann, Mueller & Larson, P.C.

(57) ABSTRACT

A work holding mechanism for horizontally holding a flat work is incorporated in work transport equipment. The holding mechanism includes a base member for supporting the work and a plurality of guide members provided at the base member. Each guide member includes a shaft, a contact portion and a limit portion. The shaft is pivotally supported by the base member. The contact portion comes into contact with part of the lower surface of the perimeter of the work and is pushed down, with the shaft as a fulcrum, when the work is placed on the base member. The limit portion is raised, with the shaft as a fulcrum, to face part of the side surface of the perimeter of the work when the contact portion is lowered.

10 Claims, 5 Drawing Sheets

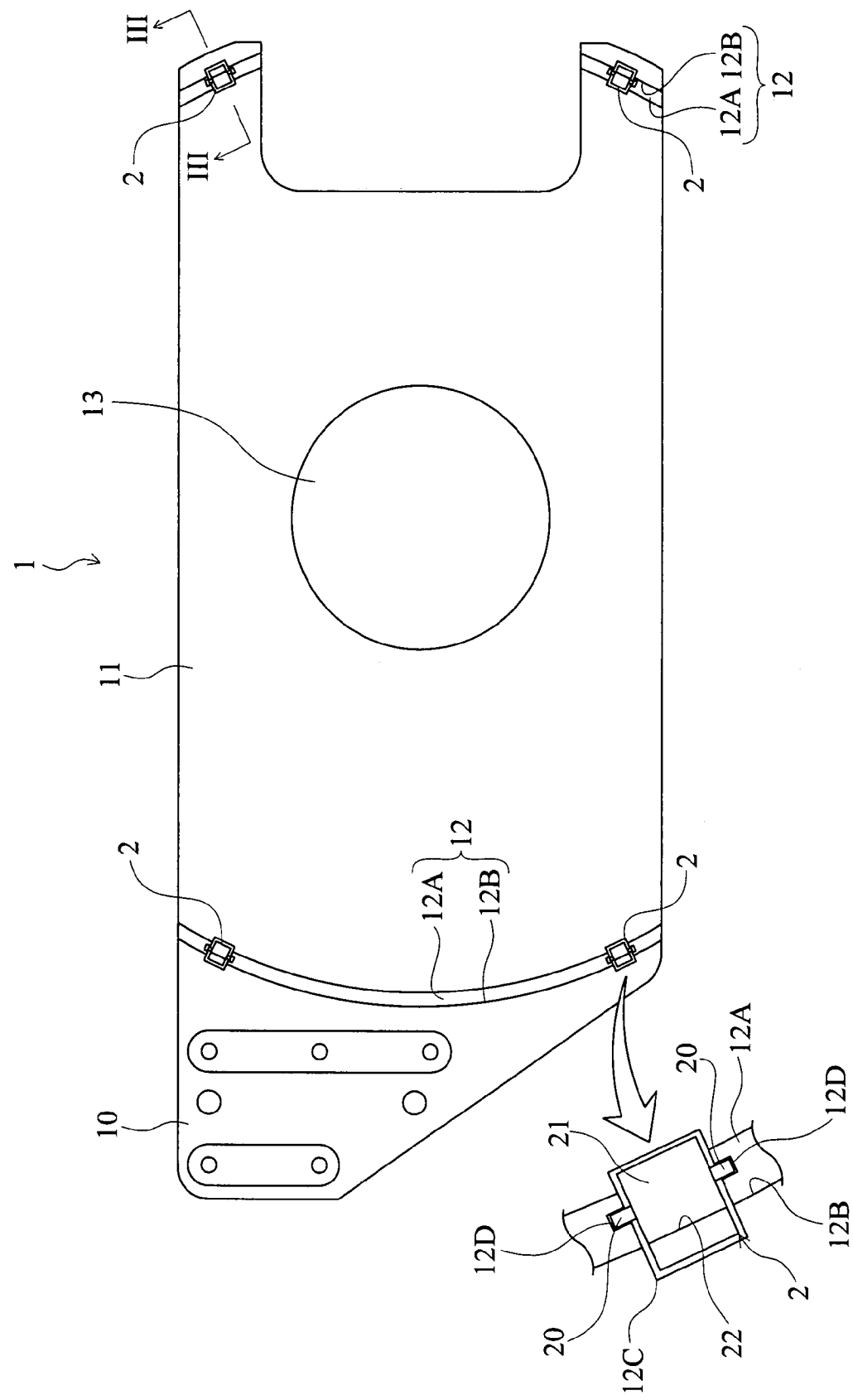

WORK HOLDING MECHANISM

BACKGROUND OF THE INVENTION

1. Field of the Invention

The present invention relates to a work holding mechanism suitable for material handling/transporting equipment configured to transport a work such as a wafer while holding the work horizontally.

2. Description of the Related Art

A conventional work holding mechanism is disclosed in JP-A-2006-150538, for example. The work holding mechanism described in this document includes a pair of tip pawls provided at a tip of a base member (transport hand), and a pair of clamp pawls for pushing a wafer, which is placed on the base member, toward the tip of the base member. The clamp pawls are pivotable in predetermined directions by an actuating mechanism such as an air cylinder, coil springs, and so on. According to such a holding mechanism, the wafer on the base member can be pushed by the clamp pawls toward the tip of the base member, thereby positioning and holding the wafer on the base member, between the clamp pawls and the tip pawls, preventing the wafer from shifting sideways while it is transported.

However, the conventional work holding mechanism uses an air cylinder to move the clamp pawls, so there is a problem that the material handling/transport equipment cannot be used under vacuum environment.

Further, the actuator for moving the clamp pawls employs a large number of different parts, resulting in a complex mechanical structure and a difficulty in weight reduction and simplification as an entire work holding mechanism.

SUMMARY OF THE INVENTION

The present invention has been proposed under the above-described circumstances. It is therefore an object of the present invention to provide a work holding mechanism that is light and simple but capable of operating in a vacuum and preventing the sliding or any other positional deviation of the work during transport to contribute to increasing the transport speed.

A work holding mechanism provide by the present invention is incorporated in work transport equipment and used for holding a flat work horizontally. The mechanism includes a base member for supporting the work and a plurality of guide members provided at the base member. Each of the guide members includes a shaft, a contact portion and a limit portion. The shaft is pivotally supported by the base member. The contact portion comes into contact with part of the lower surface of the perimeter of the work and is pushed down about the shaft when the work is placed on the base member. The limit portion is raised about the shaft to face part of the side surface of the perimeter of the work when the contact portion is lowered.

According to the above arrangement, when a work is placed on the base member, part of the work's perimeter, i.e. part of the work's lower surface, makes contact with the contact portions of the guide members. The contact portion in each of the guide members receives the weight of the work, and causes the guide member to turn or pivot about the shaft. This automatically brings the limit portions of the respective guide members to a position to prevent the work from shifting sideways, thereby attaining accurate positioning of the work. According to the work holding mechanism provided by the present invention, the guide members are configured to make a simple movement caused by the weight of the work, and applicable even in a vacuum. Such a guide member is very small in weight and simple in structure. The work holding mechanism according to the present invention reliably prevents lateral shift of the work being transported, which contributes to improvement in transportation speed.

Preferably, the base member may be provided with a stepped portion including a seating surface and an upright wall corresponding to the perimeter of the work, where the contact portion and the limit portion of the guide member constitute part of the stepped portion.

With the above arrangement, the work is reliably held at a desired position by the stepped portion of the base member as well as the contact portions and the limit portions of the guide members.

Preferably, the contact portion may be higher than the seating surface of the stepped portion when the work is not on the base member.

With the above arrangement, the base member of each guide member is reliably brought into contact with the work to be placed.

Preferably, when the work is on the base member, the limit portion may be closer to part of the side surface of the perimeter in the work than the upright wall of the stepped portion is.

With the above arrangement, the work is to be positioned accurately at the desired place by the limit portions of the guide members even if it is initially out of the accurate position due to the relatively rough positioning by the stepped portion of the base member.

Preferably, the stepped portion may be formed with grooves for supporting the shafts of the guide members, where each shaft is provided at an off-center position in the guide member for causing the guide member to tilt in a natural state, with the limit portion lowered.

With the above arrangement, the attachment of the guide members to the base member is attained easily by putting the shaft of each guide member into the groove. Further, the off-center arrangement of the shaft allows the guide members to assume an appropriately tilted position in a natural state.

Preferably, the base member and at least one of the guide members may be provided with cooperating contact terminals for electrical detection of the work in accordance with the posture of the guide member with a contact terminal.

With the above arrangement, determination of whether or not the work is on the base member is easily performed.

Other characteristics and advantages of the present invention will become clearer from description of embodiments of the invention to be made hereinafter.

BRIEF DESCRIPTION OF THE DRAWINGS

FIG. 2 is a top view of the work holding mechanism in FIG. 1.

DETAILED DESCRIPTION OF THE PREFERRED EMBODIMENTS

Preferred embodiments of the present invention will be described below with reference to the accompanying drawings.

Figure 1:
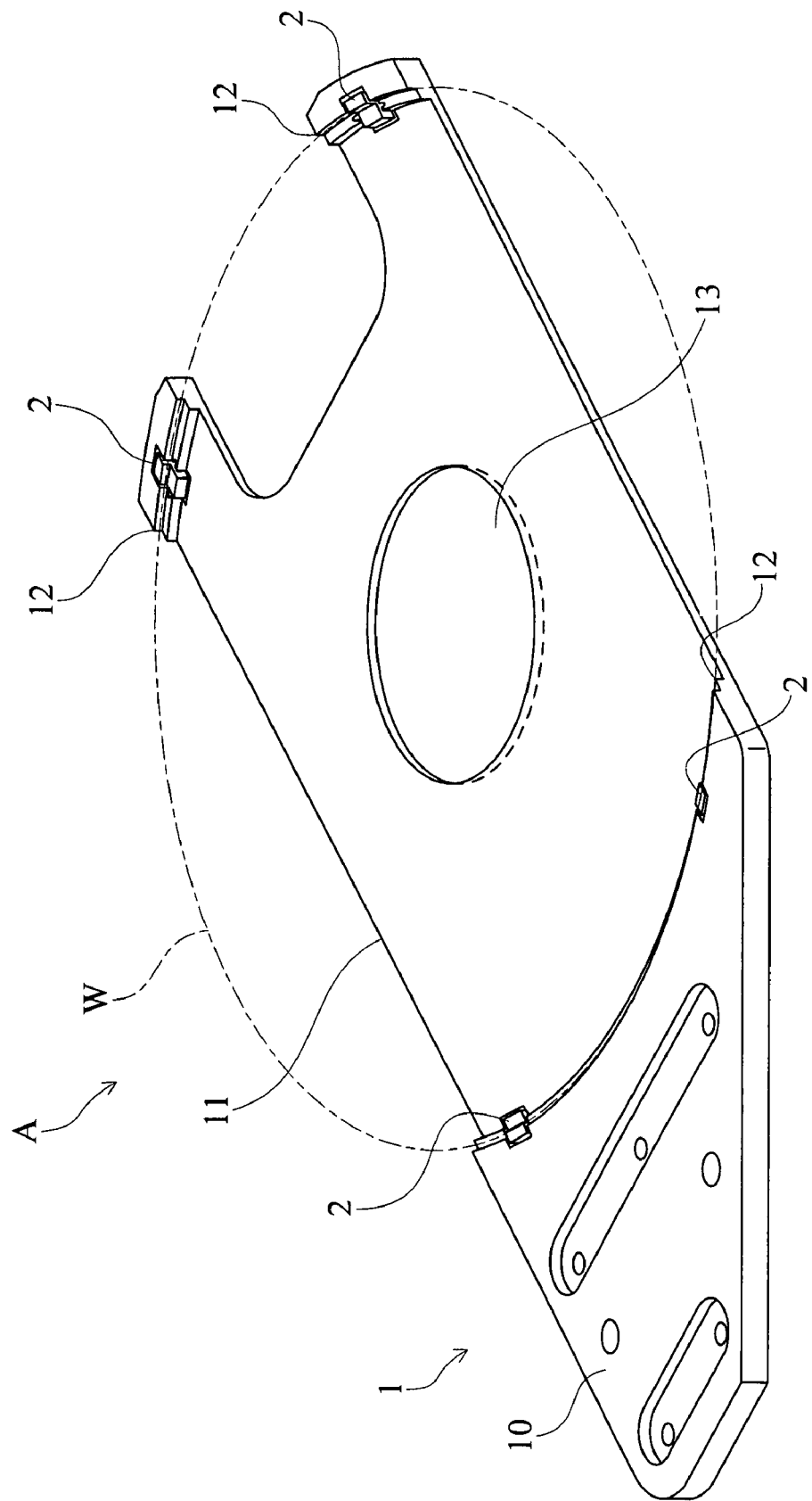
FIG. 1 is a perspective view of a work holding mechanism according to the present invention.

FIG. 1 through 3 show an embodiment of a work holding mechanism according to the present invention. The illustrated work holding mechanism A is a mechanism for horizontally holding a flat work such as a wafer W, and as shown in FIG. 1, includes a base member 1 and a plurality of guide members 2. The wafer W is formed with a cutout (orientation flat) in its perimeter, though this is not shown in FIG. 1. The wafer W has, for example, a diameter of 300±0.2 mm, a thickness of 775±25 μm and a weight of 125 g.

The base member 1 is formed of aluminum, ceramic or engineering plastic for example. The base member 1 has a base end 10 for attachment to an unillustrated arm tip of a material handling/transport equipment, and a wafer-supporting bed 11 for placement of the wafer W. For weight reduction, the width of the base end 10 over to the bed 11 is smaller than the diameter of the wafer W. The bed 11 has its tip region partially cut also for weight reduction.

As shown in FIG. 2 and FIG. 3, the bed 11 has stepped portions 12 for holding the wafer horizontally and for positioning the wafer W roughly, and an opening 13 (not illustrated in FIG. 3) for allowing the passage of a pin to come into contact with the lower surface of the wafer W. In the contact state, the pin is movable up and down through the opening 13. The stepped portions 12 correspond in position to the perimeter of the wafer W. Each of the stepped portions 12 has a seating surface 12A to fit to the lower surface of the perimeter, and an upright wall 12B to oppose to the side surface of the perimeter. The upright walls 12B are formed to give an appropriate gap with the side surface of the wafer W when the wafer W is placed accurately at a predetermined place on the base member 1. The gap is about 0.5 mm for example. The stepped portions 12 are formed with a required number of housing pits 12C (e.g. four in the present embodiment) and grooves 12D. Each of the guide members 2 is accommodated in a corresponding one of the pits 12C, and is capable of pivoting in the pit.

The guide members 2 are highly heat-resistant small parts formed of ceramic or engineering plastic for example. As shown in FIG. 2, these guide members 2 are provided in pairs so that two guide members are on a diametric line of the wafer W (not illustrated in FIG. 2). A pair of the guide members 2 and the other pair of the guide members 2 are line-symmetric to each other in a horizontal plane.

As shown in FIG. 2 and FIG. 3, the guide member 2 includes a shaft 20 pivotally placed in the grooves 12D, a contact portion 21 which makes contact with part of the lower surface in the perimeter of the wafer W, and a limit portion 22 which opposes to part of the side surface of the wafer W. The shaft 20 has a diameter of approximately 1 mm. The overall length including the contact portion 21 and the limit portion 22 is approximately 5 mm, in which the limit portion 22 is approximately 2 mm. The overall thickness including the limit portion 22 is approximately 3 mm.

The contact portion 21 and the limit portion 22 of the guide member 2 constitute part of the seating surface 12A and the upright wall 12B, respectively. An end of the lower surface of the guide member 2 is provided with a contact terminal 30, and at a place corresponding to the terminal 30, the housing pit 12C of the base member 1 is provided with a contact terminal 40. Depending on the posture of the guide member 2, the two contact terminals 30, 40 are brought into or out of contact with each other (see FIGS. 3A-3C). These contact terminals 30, 40 are for electrical detection of whether or not the wafer W is present on the base member 1, and are connected to a work detection unit 50 including a control circuit, for example. The work detection unit 50 may be incorporated in the main body of the material handling/transport equipment or in a control unit separate from the equipment itself. The contact terminals 30, 40 and the work detection unit 50 need be provided for at least one of the guide members 2. As a variation, the contact terminals 30, 40 and the work detection unit 50 may be provided for two of the guide members 2 such as right and left ones or front and back ones. All the guide members 2 may be provided with separate detection systems each including two cooperating contact terminals and a work detection unit connected to these terminals.

Figure 3A:
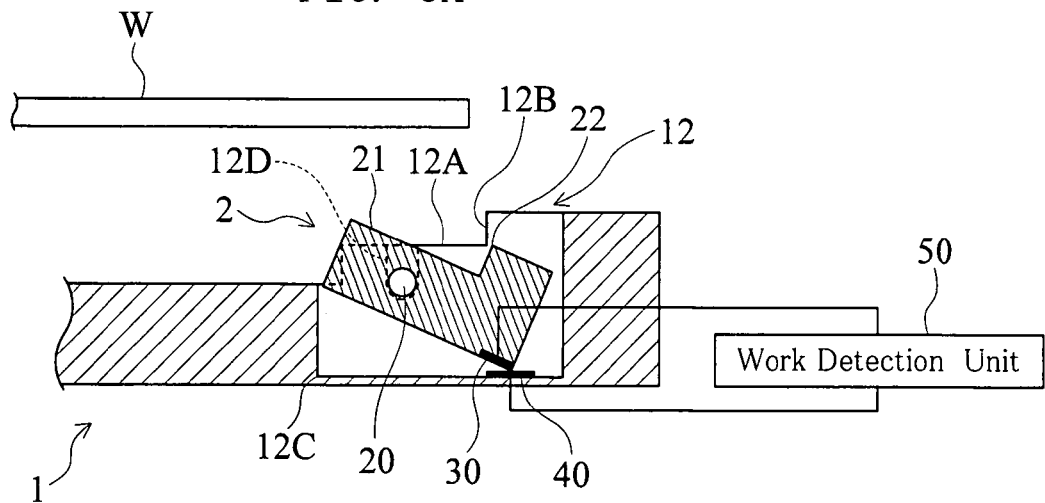
FIG. 3A through FIG. 3C are sectional views taken in lines III-III in FIG. 2, for explaining the work detecting operation.
Figure 3B:
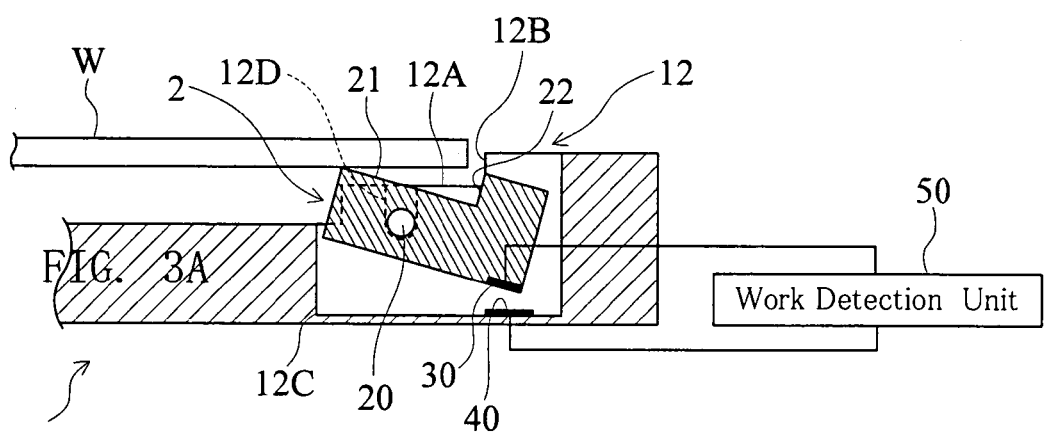

As shown in FIG. 3A, the shaft 20 is closer to the tip of the contact portion 21, in other words, off the center of the guide member 2, while it is rested in the groove 12D in the stepped portion 12. Thus, in a natural state, the guide member 2 will tilt about the shaft 20 due to gravity, with the limit portion 22 lowered. In this arrangement, when no wafer W is placed on the base member 1, the tip of the contact portion 21 in the guide member 2 is higher than the seating surface 12A. On the other hand, when a wafer W is placed on the base member 1 as shown in FIG. 3B, the tip of the contact portion 21 is pressed down by the lower surface of the perimeter in the wafer W, causing the guide member 2 to rotate counterclockwise (as seen in FIG. 3B) about the shaft 20. As a result, the limit portion 22, which is opposite to the tip of the contact portion 21, is raised up to come into direct contact with the side surface of the perimeter of the wafer W or to face the same side surface with a very narrow gap provided therebetween (see FIG. 3C). This gap may be about 0.1 mm, for example, taking it into account that the diameter of the wafer W has a dimensional error of ±0.2 mm. In the upright state shown in FIG. 3C, the limit portion 22 is closer to the side surface of the perimeter of the wafer W than the upright wall 12B of the base member 1 is. With such an arrangement, the wafer W can be positioned more accurately by the limit portion 22 than by the upright wall 12B.

Figure 4:
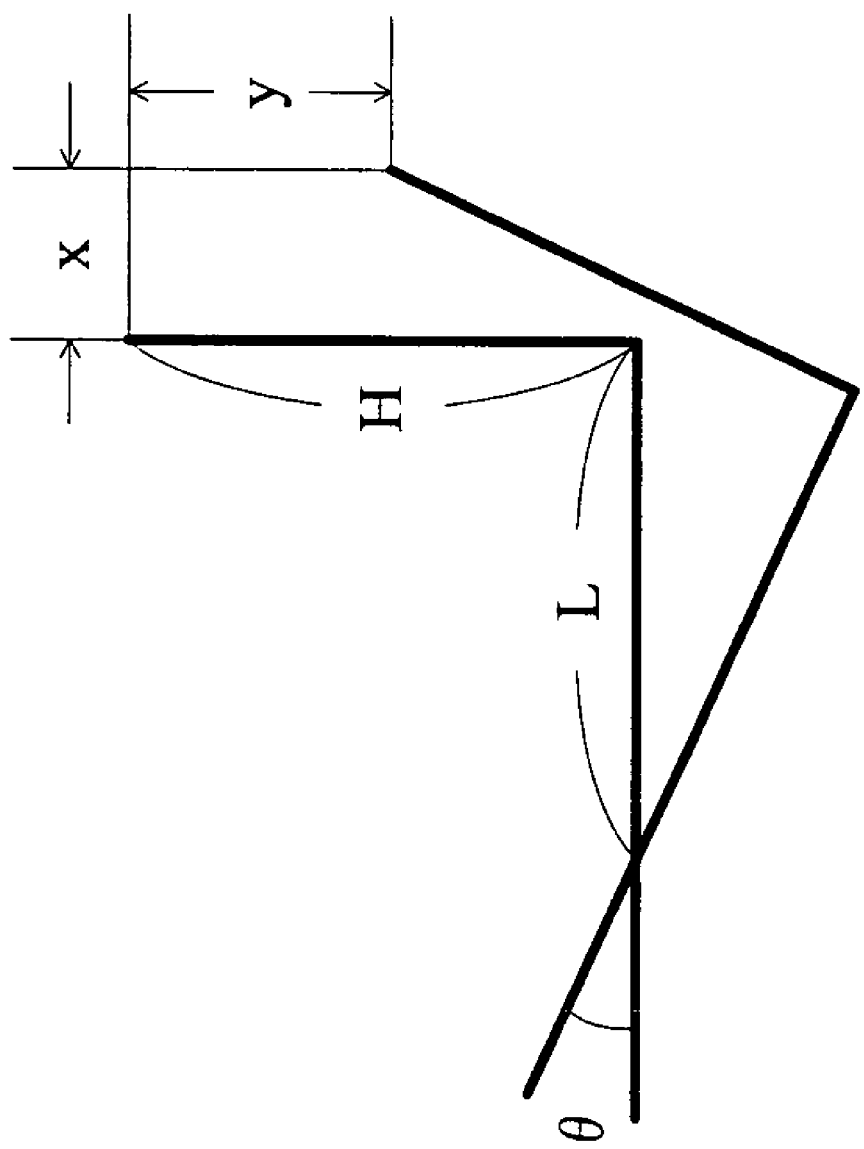
FIG. 4 is a diagram to illustrate several dimensions of the work holding mechanism in FIG. 1.

FIG. 4 is a diagram to show various dimensions of the guide members 2. A dimensions H and L shown in the figure represent the vertical height and the horizontal distance from the shaft 20 to the limit portion 22 while the angle θ represents an angle of movement of the contact portion 21 from its tilted state to the horizontal state. Dimensions x and y represent the horizontal distance and the vertical distance in the movement of the upper tip of the limit portion 22. The horizontal distance x is preferably not smaller than 0.5 mm in consideration of the positional relationship between the limit portion 22 and the upright wall 12B, whereas the vertical distance y is preferably not greater than 1 mm in consideration with the thickness of the wafer W and the height of the upright wall 12B. As shown in the figure, the horizontal distance x, which is the distance in the movement of the upper tip of the limit portion 22, satisfies a relationship: $x = L \cos θ + H \sin θ - L$. Likewise, the vertical distance y satisfies a relationship: $y = L \sin θ$. As an example, when the vertical height H is 2 mm, the horizontal length L is 2 mm, and the angle of movement θ is 25 degrees, the above formulas give x=0.66 mm and y=0.85 mm. These values meet the above-described conditions $x \geq 0.5$ mm and $y \leq 1$ mm. This implies that, even if the guide members 2 are very small, appropriate dimensions will enable one to enjoy the desired movement.

The operation of the work holding mechanism A will be described below.

As shown in FIG. 3A, in the natural state where there is no wafer W placed on the base member 1, the guide member 2 is tilted, with the tip of contact portion 21 being higher than the seating surface 12A. In this state, the contact terminal 30 in the guide member 2 is in contact with the contact terminal 40 in the base member 1, so the work detection unit 50 detects electrical conductivity and determines that there is no wafer W placed on the base member 1.

Next, as shown in FIG. 3B, when a wafer W is placed on the base member 1, part of the lower surface in the perimeter of the wafer W makes contact with the tip of the contact portion 21, and the tip is pushed down due to the weight of the wafer W. On the other hand, the limit portion 22 is raised up and approaches the side surface of the wafer W more closely than the upright wall 12B. Accordingly, even if the side surface of the wafer W is initially located very close to or in contact with the upright wall 12B, the limit portion 22 as rising comes into contact with the side surface of the wafer W and pushes the wafer W toward the center of the proper positioning area of the wafer.

Figure 3C:
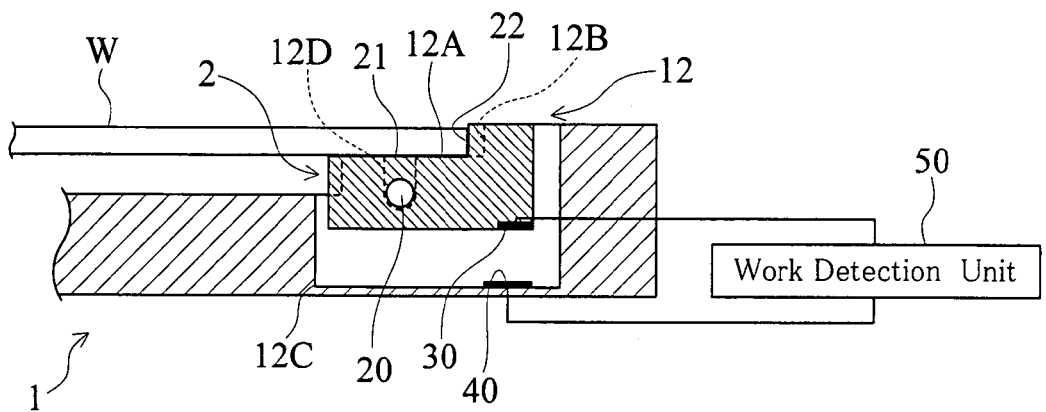

Then, when the wafer W is completely set on the base member 1 as shown in FIG. 3C, the lower surface of the perimeter of the wafer W makes contact with the contact portions 21 and the seating surfaces 12A, with the guide members 2 held substantially horizontally. In this state, all the limit portions 22 of the guide members 2 are close enough to the side surface of the wafer W, whereby the wafer W is positioned accurately to the desired place on the base member 1. At this stage, the contact terminal 30 in the guide member 2 has been out of contact with the contact terminal 40 in the base member 1. Thus, the work detection unit 50 detects the disconnection of the circuit and determines that the wafer W is loaded on the base member 1. After the work detection unit 50 detects the loading of the wafer W, the arm of the main body of the material handling/transport equipment is driven to operate the work holding mechanism A (which is attached to an end of the arm) in required directions (up, down, right, left, forward and backward). During this operation, the wafer W, clamped by the four guide members 2, remains unmoved relative to the base member 1. Accordingly, the wafer W is accurately transported to a predetermined unloading place even at high operation speed.

The work holding mechanism A described above is capable of performing proper operation in a vacuum or at high temperature, together with the material handling/transport equipment.

The guide members 2 for preventing the positional shifting of the wafer W are operable only by the weight of the wafer W. Such guide members are simple in structure and small in weight, which contributes to weight reduction in the work holding mechanism A.

Figure 5:
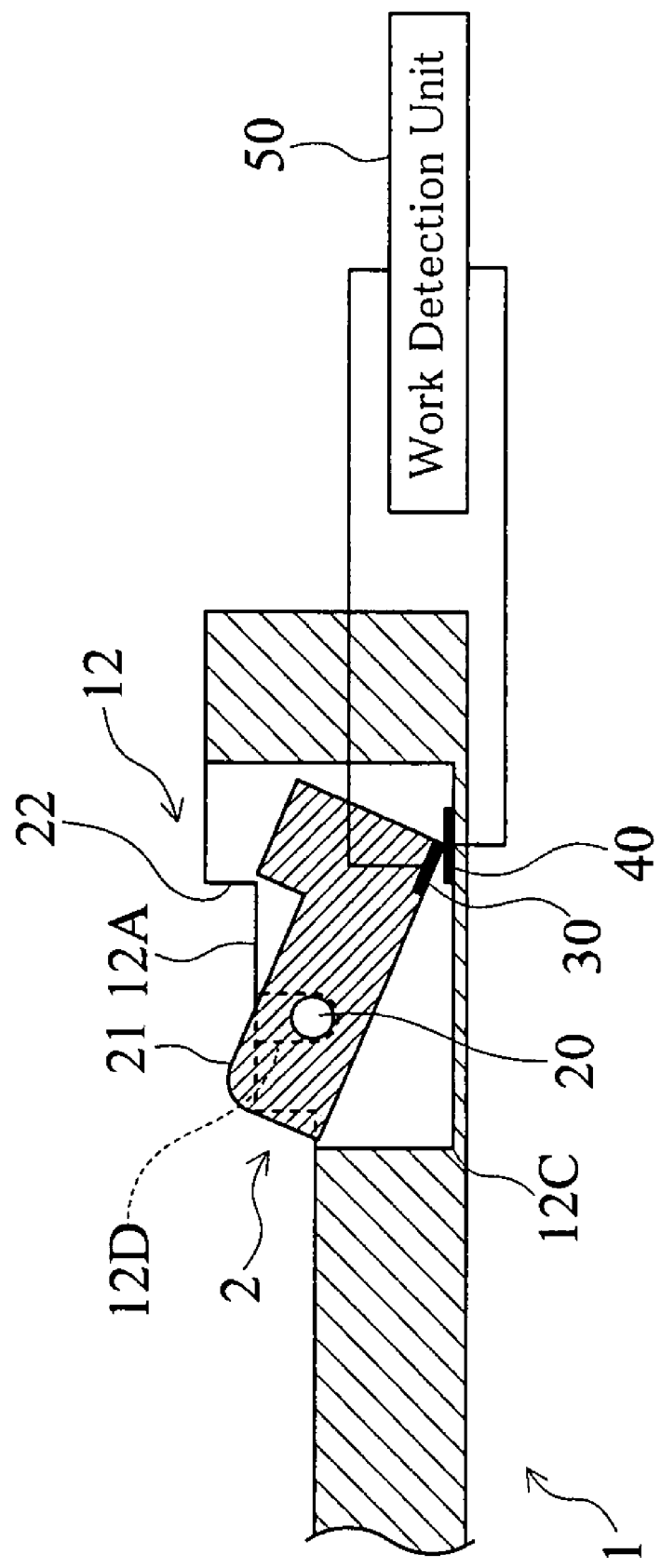
FIG. 5 is a sectional view showing a main portion of another example of work holding mechanism according to the present invention.

The present invention is not limited to the embodiment described above. For instance, as shown in FIG. 5, the contact portion 21 may have a round tip with which a wafer to be carried makes first contact. Such a curved shape prevents the contact portion 21 from damaging the lower surface of the wafer. Further, the stepped portion of the base member or the limit portion of a guide member may have a non-upright wall that slants away from the center of a supported wafer as proceeding upward.

The invention claimed is:

1. A work holding mechanism to hold a flat work horizontally for work transport equipment, the mechanism comprising:
    a base member for supporting the work; and
    a plurality of guide members provided at the base member;
    wherein each guide member includes a shaft, a contact portion and a limit portion, the shaft being pivotally supported by the base member, the contact portion coming into contact with part of a lower surface of a perimeter of the work and being pushed down about the shaft when the work is placed on the base member, the limit portion being raised about the shaft to face part of a side surface of the perimeter of the work when the contact portion is lowered; and
    wherein the base member is provided with a stepped portion including a seating surface and an upright wall corresponding to the perimeter of the work, the contact portion and the limit portion of the guide member constituting part of the stepped portion.

2. The work holding mechanism according to claim 1 wherein the contact portion is higher than the seating surface of the stepped portion when the work is not on the base member.

3. The work holding mechanism according to claim 1, wherein the limit portion is closer to part of the side surface of the perimeter in the work than the upright wan of the stepped portion is when the work is on the base member.

4. The work holding mechanism according to claim 1, wherein the stepped portion is formed with grooves for supporting the shafts of the guide members, each shaft being provided at an off-center position in the guide member for causing the guide member to tilt in a natural state, with the limit portion lowered.

5. The work holding mechanism according to claim 1, wherein the base member and at least one of the guide members are provided with contact terminals for electrical detection of the work in accordance with a posture of said at least one of the guide members.

6. A work holding mechanism to hold a flat work horizontally for work transport equipment, the mechanism comprising:
    a base member for supporting the work; and
    a plurality of guide members provided at the base member;
    wherein each guide member includes a shaft, a contact portion and a limit portion, the shaft being pivotally supported by the base member, the contact portion coming into contact with part of a lower surface of a perimeter of the work and being pushed down about the shaft when the work is placed on the base member, the limit portion being raised about the shaft to face part of a side surface of the perimeter of the work when the contact portion is lowered; and
    wherein the base member and at least one of the guide members are provided with contact terminals for electrical detection of the work in accordance with a posture of said at least one of the guide members.

7. The work holding mechanism according to claim 6, wherein the base member is provided with a stepped portion including a seating surface and an upright wall corresponding to the perimeter of the work, the contact portion and the limit portion of the guide member constituting part of the stepped portion.

8. The work holding mechanism according to claim 7, wherein the contact portion is higher than the seating surface of the stepped portion when the work is not on the base member.

9. The work holding mechanism according to claim 7, wherein the limit portion is closer to part of the side surface of the perimeter in the work than the uptight wall of the stepped portion is when the work is on the base member.

10. The work holding mechanism according to claim 7, wherein the stepped portion is formed with grooves for supporting the shafts of the guide members, each shaft being provided at an off-center position in the guide member for causing the guide member to tilt in a natural state, with the limit portion lowered.

* * * * *